(12) United States Patent
Aizenberg et al.

(10) Patent No.: US 8,993,063 B2
(45) Date of Patent: Mar. 31, 2015

(54) LOW-TEMPERATURE SYNTHESIS OF SILICA

(75) Inventors: Joanna Aizenberg, Boston, MA (US); Benjamin Hatton, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 158 days.

(21) Appl. No.: 13/702,497

(22) PCT Filed: Jun. 8, 2011

(86) PCT No.: PCT/US2011/039625
§ 371 (c)(1),
(2), (4) Date: May 17, 2013

(87) PCT Pub. No.: WO2011/156484
PCT Pub. Date: Dec. 15, 2011

(65) Prior Publication Data
US 2013/0236641 A1   Sep. 12, 2013

Related U.S. Application Data

(60) Provisional application No. 61/352,643, filed on Jun. 8, 2010.

(51) Int. Cl.
*B05D 3/10* (2006.01)
*C23C 16/40* (2006.01)
*C23C 16/455* (2006.01)
*C23C 16/54* (2006.01)

(52) U.S. Cl.
CPC ............. *C23C 16/402* (2013.01); *B05D 3/105* (2013.01); *B05D 3/107* (2013.01); *B05D 3/10* (2013.01); *C23C 16/45525* (2013.01); *C23C 16/45534* (2013.01); *C23C 16/45551* (2013.01); *C23C 16/45595* (2013.01); *C23C 16/545* (2013.01)
USPC ............................ 427/344; 427/337; 427/343

(58) Field of Classification Search
None
See application file for complete search history.

(56) References Cited

U.S. PATENT DOCUMENTS

| 5,711,811 | A | 1/1998 | Suntola et al. |
| 5,895,933 | A | 4/1999 | Zhang et al. |
| 6,037,277 | A | 3/2000 | Masakara et al. |
| 6,090,442 | A | 7/2000 | Klaus et al. |
| 6,391,803 | B1 | 5/2002 | Kim et al. |
| 6,482,733 | B2 | 11/2002 | Raaijmakers et al. |
| 6,548,424 | B2 | 4/2003 | Putkonen |
| 6,610,145 | B2 | 8/2003 | Hendricks et al. |

(Continued)

FOREIGN PATENT DOCUMENTS

| CN | 1918322 A | 2/2007 |
| CN | 101182633 A | 5/2008 |
| WO | WO-03/008110 A1 | 1/2003 |

OTHER PUBLICATIONS

Hatton et al, J. Chem. Mater. 20, pp. 6009-6013, 2010.*

(Continued)

*Primary Examiner* — Erma Cameron
(74) *Attorney, Agent, or Firm* — Wilmer Cutler Pickering Hale and Dorr LLP (57) ABSTRACT

An ambient pressure Atomic Layer Deposition (ALD) technique to grow uniform silica layers onto organic substrates at low temperatures, including room temperature, is described. For example, tetramethoxysilane vapor is used alternately with ammonia vapor as a catalyst in an ambient environment.

19 Claims, 6 Drawing Sheets

(56) References Cited

U.S. PATENT DOCUMENTS

| | | | |
|---|---|---|---|
| 6,818,250 | B2 | 11/2004 | George et al. |
| 7,300,873 | B2 | 11/2007 | Millward |
| 7,642,199 | B2 | 1/2010 | Meredith et al. |
| 7,678,709 | B1 | 3/2010 | Lu et al. |
| 2002/0018849 | A1* | 2/2002 | George et al. ............ 427/255.27 |
| 2005/0084610 | A1* | 4/2005 | Selitser ...................... 427/248.1 |
| 2005/0233598 | A1 | 10/2005 | Jung et al. |
| 2006/0040510 | A1 | 2/2006 | Lee et al. |
| 2006/0213437 | A1* | 9/2006 | Ishizaka et al. ................ 118/715 |
| 2006/0286813 | A1* | 12/2006 | Meredith et al. .............. 438/781 |
| 2007/0190777 | A1 | 8/2007 | Jiang et al. |
| 2008/0071382 | A1 | 3/2008 | Kumar et al. |
| 2008/0315295 | A1* | 12/2008 | Ji et al. ........................... 257/325 |
| 2009/0137043 | A1* | 5/2009 | Parsons et al. ................. 435/398 |
| 2009/0209081 | A1 | 8/2009 | Matero et al. |
| 2009/0238997 | A1* | 9/2009 | De Vries et al. .............. 427/569 |
| 2009/0256262 | A1 | 10/2009 | Farnworth et al. |
| 2009/0324971 | A1* | 12/2009 | De Vries et al. .............. 428/446 |

OTHER PUBLICATIONS

Nishiyama et al, Chem. Mater. 15, pp. 1006-1011, 2003.*

Carturan et al, Journal of Materials Chemistry, 14(14), pp. 2087-2098, 2004.*

Tanaka et al, JACS, 126, pp. 4854-4858, 2004.*

Ferguson, J.D. et al., "ALD of $SiO_2$ at Room Temperature Using TEOS and $H_2O$ with $NH_3$ as the Catalyst," Journal of The Electrochemical Society, vol. 151, No. 8, pp. G528-G535 (No month listed 2004).

Klaus, J.W. et al., "$SiO_2$ Chemical Vapor Deposition at Room Temperature Using $SiCl_4$ and $H_2O$ with an $NH_3$ Catalyst," Journal of The Electrochemical Society, vol. 147, No. 7, pp. 2658-2664 (Mar. 24, 2000).

Kákos, J. et al., "Ultrathin insulating silica layers prepared from adsorbed TEOS, $H_2O$ and $NH_3$ as a catalyst," Microelectronics Journal, vol. 39, pp. 1626-1628 (Mar. 18, 2008).

Levy, D.H. et al., "Stable ZnO thin film transistors by fast open air atomic layer deposition," Applied Physics Letters, vol. 92, 3 pages (2008).

No Author Listed, "Volatile Precursors for NanoFabrication," ChemFiles, vol. 4, No. 3, 16 pages (2004).

Notification of First Office Action from The State Intellectual Property Office of The People's Republic of China for Application No. 201180036453.4 mailed on May 14, 2014 (21 pages).

* cited by examiner

Fig. 5

LOW-TEMPERATURE SYNTHESIS OF SILICA

CROSS REFERENCE TO RELATED APPLICATIONS

The present application is a national stage application of International Application No. PCT/US2011/39625, filed on Jun. 8, 2011, which claims the benefit of the earlier filing date of U.S. Pat. No. 61/352,643, filed on Jun. 8, 2010, the contents of which is incorporated by reference herein in its entirety.

STATEMENT REGARDING FEDERALLY SPONSORED RESEARCH OR DEVELOPMENT

The present invention was made with United States government support under Grant No. N00014-07-1-0690-DOD35CAP awarded by the Office of Naval Research, and under Grant No. FA9550-09-1-0669-DOD35CAP awarded by the Air Force Office of Scientific Research. The United States government has certain rights in this invention.

INCORPORATION BY REFERENCE

All patents, patent applications and publications cited herein are hereby incorporated by reference in their entirety in order to more fully describe the state of the art as known to those skilled therein as of the date of the invention described herein.

FIELD OF TECHNOLOGY

This technology relates generally to silica or silica-like thin films. In particular, this technology relates to low temperature deposition of silica thin films.

BACKGROUND

Deposition of silica can be achieved from the vapor phase by chemical vapor deposition (CVD), sputtering or atomic layer deposition (ALD). ALD is a technique for growing controlled monolayers using self-limiting surface reactions with reactive vapor precursors, and sequentially growing such monolayers into a film of controlled thickness. A wide range of inorganic materials, including $Al_2O_3$, $TiO_2$, ZnO, and ZnS can be grown as uniform layers of highly-controlled thickness 0.10~0.20 nm per step. However, the high temperatures (i.e.; 150 to 800° C.) and vacuum conditions that are normally required can limit ALD for widespread use.

SUMMARY

The low-temperature synthesis of nanoscale silica multilayers under ambient pressures is described. The method permits the low-temperature, ambient pressure deposition of uniform, well-controlled, nanometer-scale silica layers that show high connectivity and mechanical stability at ambient pressure using a simple alkoxide precursor, and without the use of expensive high vacuum equipments.

In one aspect, a method of forming a silica film includes exposing the substrate to a vapor of a precursor that has a low reactivity with moisture at ambient conditions (e.g., ambient temperature and/or pressure) such that the metal alkoxide is adsorbed onto the substrate; and converting the adsorbed metal alkoxide into metal oxide dioxide by exposure to water vapor and a catalyst at ambient conditions.

In certain embodiments, the substrate is a temperature sensitive substrate and the temperature of the substrate is below a temperature that destabilizes, decomposes or melts the substrate.

In certain embodiments, tetramethoxysilane (TMOS) is used for the low temperature growth of multiple silica nanolayers in an ambient environment.

In certain embodiments, the alkoxysilane ALD method can be used to grow silica multilayers around polymer colloidal spheres and within a colloidal crystal (opal) structure.

In certain embodiments, the alkoxysilane ALD method can be used to coat silica on temperature sensitive substrates, such as plastics.

In certain embodiments, the alkoxysilane ALD method can be used to coat silica on temperature sensitive substrates, such as biological materials, e.g., cells.

The rapid and simple nature of this method means it can easily be applied for the controlled deposition of nanoscale silica layers without the need for a sophisticated ALD system.

BRIEF DESCRIPTION OF THE DRAWING

The invention is described with reference to the following figures, which are presented for the purpose of illustration only and are not intended to be limiting.

DETAILED DESCRIPTION

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. Embodiments described herein can be used alone or in combination with other embodiments, as would be apparent to one of skill in the art. In addition, the materials, methods, and examples are illustrative only and not intended to be limiting.

By 'ambient temperature' as that term is used herein, it is meant the temperature of the surroundings in which the deposition is taking place. The system can be open to its surroundings. The ambient temperature is not controlled or altered by external means. Thus, ambient temperature can include room temperature. It is recognized that atmospheric temperature can vary based on location, elevation, and or time of day or year.

By 'ambient pressure' as that term is used herein, it is meant the pressure of the surroundings in which the deposition is taking place. The system can be open to its surroundings. The ambient pressure is not controlled or altered by external means. Thus, ambient pressure can include atmospheric pressure. It is recognized that atmospheric pressure can vary based on location and elevation.

'Plastic' is the general term for a wide range of synthetic or semi-synthetic organic polymeric materials used in the manufacture of industrial products. Plastics are typically polymers of high molecular mass, and may contain other substances to improve performance and/or reduce costs.

'Biological material' is the general term for a wide range of biological structures. These are typically cells, membranes, viruses, bacteria, etc.

In one aspect, a silica film can be deposited at ambient pressures by exposing the substrate to a vapor of alkoxysilane at ambient pressure such that the alkoxysilane is adsorbed onto the substrate and converting the adsorbed alkoxysilane into silica dioxide by exposure to water vapor and a catalyst at ambient pressure.

The use of ambient pressure instead of the more conventional subatmospheric operating pressures can result in a significant increase in the concentration of reactants and a proportionally higher reaction rate.

Figure 1:
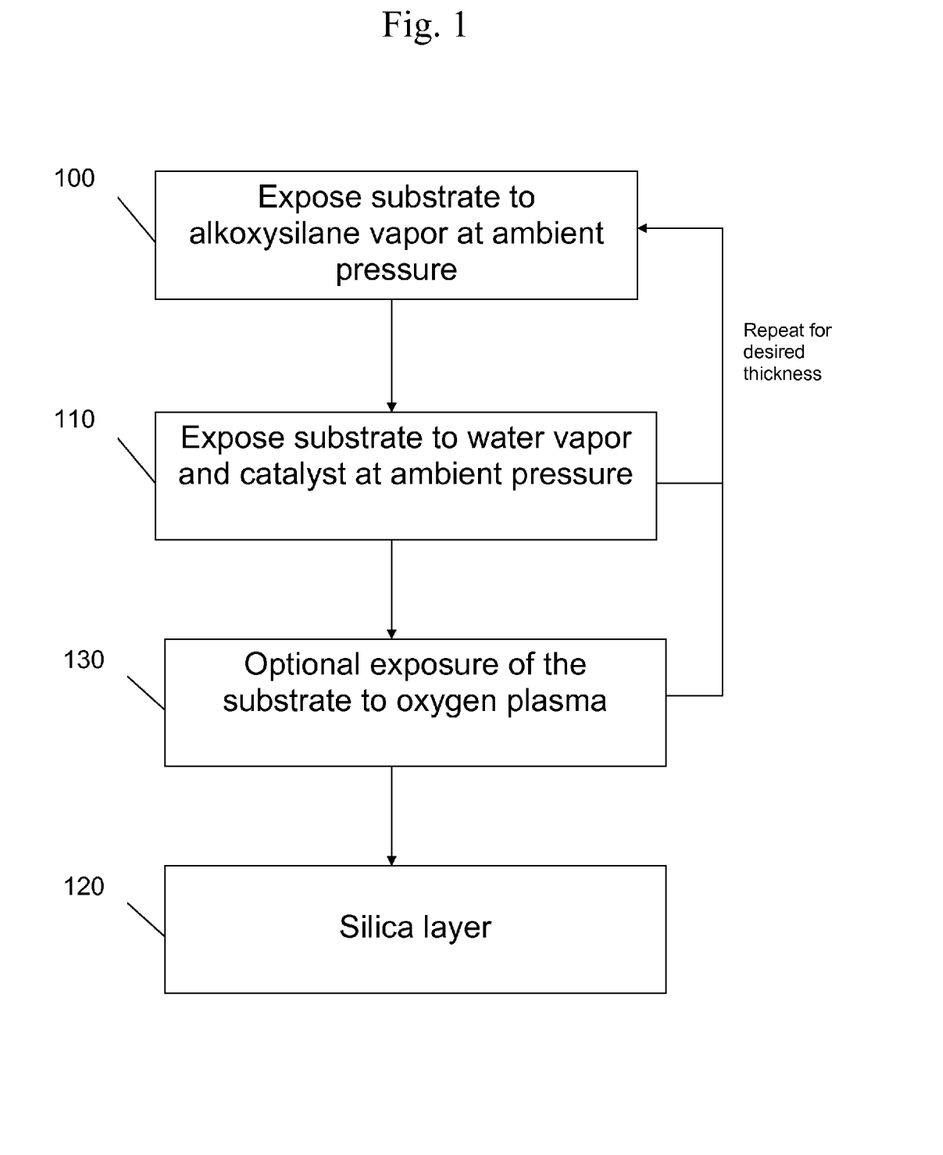
FIG. 1 is a schematic flow diagram illustrating a method of depositing a silica layer according to certain embodiments.

The process for the manufacture of a silica layer is described with reference to FIG. 1. In a first step 100, a substrate is exposed to a vapor of an alkoxysilane at ambient pressure. The silane is adsorbed onto the substrate in a self-limiting process so that a substantially single layer of alkoxysilane is provided on the surface. The temperature can be at or below about 150° C., 125° C., 100° C., 75° C., 50° C., or even ambient temperatures. In certain embodiments, the alkoxysilane is at room temperature. In certain embodiments, an alkoxysilane reservoir can be heated to provide a desired concentration, e.g., vapor pressure, of the alkoxysilane in the vapor phase. The alkoxysilane reservoir can be heated for example up to about 100° C. or for example to between about 40-80° C. The alkoxysilane can be any alkoxysilane having sufficient volatility and reactivity at ambient pressure and temperatures. For example, the alkoxysilane may not react with other reactants until a catalyst is provided to initiate the reaction.

In certain embodiments, the alkoxysilanes are selected so that the alkoxysilane does not substantially react with other reactants (e.g., oxygen gas or water molecules) that are present in ambient pressure conditions until a catalyst is provided. In certain embodiments, the alkoxysilanes are selected so that the alkoxysilanes do not substantially react with other reactants (e.g., oxygen gas or water molecules) that are present in ambient pressure conditions during the exposure time of the alkoxysilane, such as second or minutes or even an hour. For example, the exposure time to the alkoxysilane vapor can vary depending on the reactivity (e.g., adsorption rate, reactivity with reactants in ambient pressures) and vapor pressure of the compound and temperature. Thus, higher reactivity and/or greater vapor pressure may require a shorter exposure time than compounds with lower reactivity or vapor pressure. Reactant temperature can also reduce exposure time for a given deposition rate. In non-limiting examples of exposure time, the substrate can be coated within a time ranging from about 1 second to 120 minutes, such as several seconds to about 60 minutes. Shorter exposure times may be more suitable for an industrial process.

For example, alkoxysilane can be tetramethoxysilane (TMOS) or triethoxysilane (TEOS) or mixtures thereof. In certain embodiments, TMOS provides a silica deposition rate that is 3-4 times greater than that of TEOS.

In a second step 110, the alkoxysilane adsorbed substrate is then exposed to water vapor in the presence of a suitable catalyst. The water reservoir can be used at room temperature; alternatively, it can be heated to increase the vapor pressure and for example can be heated to between about 40-60° C. The alkoxysilane can react with the water vapor to convert the alkoxysilane to silica, as indicated in step 120.

In certain embodiments, the catalyst can be ammonia, or hydrated forms of the same.

In certain embodiments, the catalyst is ammonia and the reactant can be ammonia water, e.g., $NH_4OH$.

Without wishing to be bound by theory, in certain embodiments, the $NH_3$ vapor can catalyze the hydrolysis of methoxy groups and aid in the condensation polymerization of surface silanol groups.

The exposure time to water vapor may be for a time sufficient to convert the adsorbed alkoxysilane into silica. The exposure time to the water vapor can vary depending on reactivity of the alkoxysilane, concentration of surface hydroxyl groups and substrate temperature. In nonlimiting examples of exposure time, the substrate can be a time ranging from several, e.g. 5 seconds to 60 minutes, such as from 30 seconds to 60 minutes.

Steps 100 and 110 can be repeated as needed until the desired silica thickness is obtained as noted in 115. The number of cycles can vary from 1 to 1000 and can be for example in the range of 10 to 100. The average deposition rate will vary depending on the reactants used and deposition conditions. In certain embodiments, the average deposition rate can range from about 0.05 nm to 10 nm per alkoxysilane exposure cycle, or between about 0.2 nm to 0.3 nm per cycle, or between about 2 nm to 4 nm. Higher growth rates can be expected with optimization of the deposition conditions. Growth rate for such deposition reactions typically depends on the relative humidity and the thickness of the adsorbed hydration layer. Such conditions are typically controlled by controlling the deposition conditions using sophisticated, closed vacuum systems. It has been surprisingly discovered that nanoscale control over the thickness and composition of the deposited layer can be achieved under ambient conditions and without use of a closed vacuum system.

An optional step 130 may include exposure of the film to a reactive oxygen species to help ensure sufficient surface hydroxylation. For example, reactive oxygen exposure can take place after about 1, 5, 10, 15 or 100 cycles have occurred. Reactive oxygen species can be generated using oxygen plasma, which is a vacuum process. The reactive oxygen species can also be generated using corona discharge. A corona discharge device is portable, even handheld, and can operate at ambient conditions. Corona discharge can be integrated into a continuous process.

The substrate can be any substrate, for example, glass, ceramics, biological material or polymer plastics. The method is particularly advantageous however for plastics, biological materials and other temperature-sensitive substrates because silica layers of uniform thickness and composition can be deposited a low temperatures. In certain embodiments, the substrate is maintained at temperatures below its decomposition or melting temperature. For example, the substrate is maintained at temperatures below 100° C., and in certain embodiments, the temperature of the substrate is about room temperature, e.g., 25-35° C.

In certain embodiments, after the deposition has been carried out, the underlying substrate can be a sacrificial material that can be removed after ALD has been carried out. For example, after silica has been deposited over plastic nanoparticles, the plastic nanoparticles can be dissolved, etched, or burned away leaving hollow nanospheres of silica.

The deposition method can be carried out in an open system, without the need to purge the surface before the next exposure as the process has been shown to be relatively insensitive to residual gas phase reactants from the previous exposures. Thus, for example, the system can be carried out without the need for closed systems or complicated purging systems that are typically required of ALD processes. Of course, such conventional systems may be used if desired. Non-limiting examples of CVD/ALD systems suitable for use at atmospheric pressures include U.S. Published Application No. 2005/0084610 entitled "Atmospheric Pressure Molecular layer CVD," which is hereby incorporated by reference in its entirety.

The alternating exposure to the alkoxide and catalyst vapor (e.g., ammonia) can also take place in a continuous flow environment. For example, a substrate could be physically moved from a semi-closed chamber flowing the alkoxide vapor (with some inert carrier gas such as nitrogen), to an adjacent semi-closed chamber flowing ammonia. Or, for example, the flows of each gas could be directed, alternately, at a substrate surface. Accordingly, a continuous processing line to deposit metal oxide over a polymer film can be envisioned, without the need for expensive vacuum equipments to purge the environments.

Figure 2A:
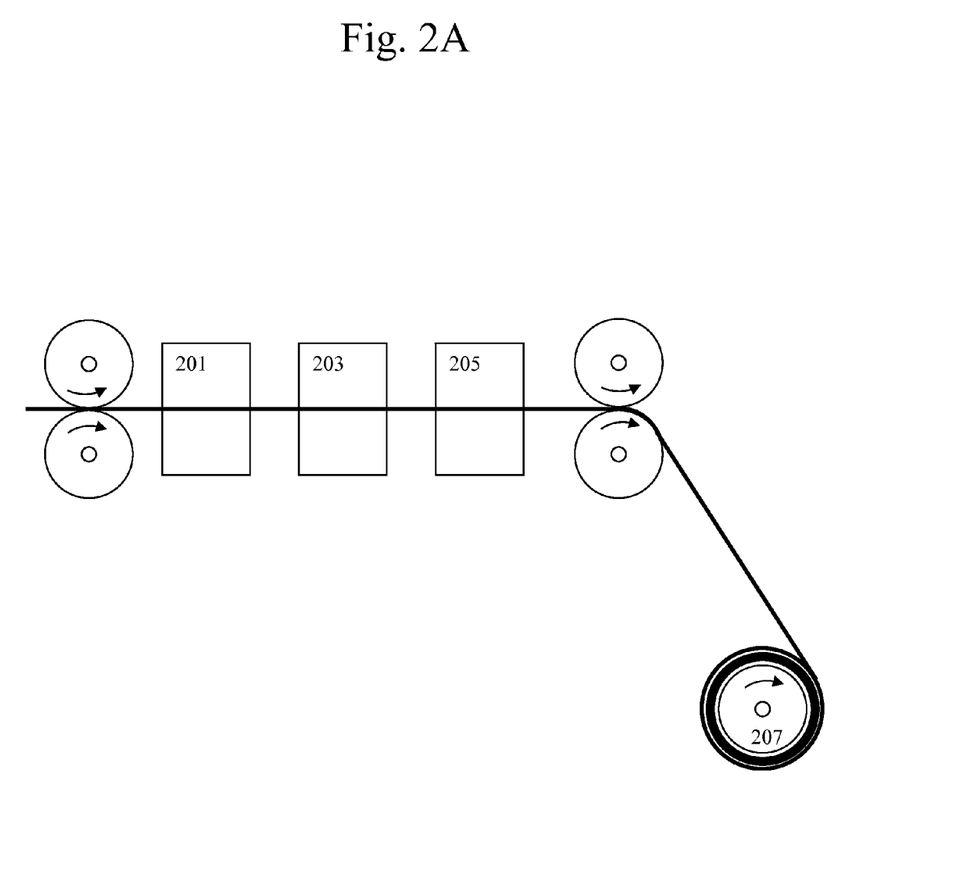
FIGS. 2A and 2B schematically show polymer sheet processing lines where the polymer is provided with a silica layer in accordance with certain embodiments.
Figure 2B:
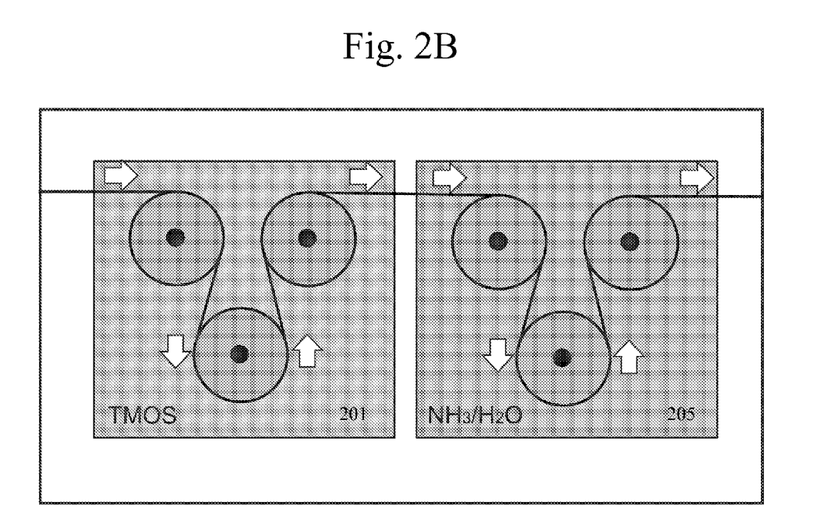

For example, polymer sheets are traditionally processed by passing them through a series of rollers. The present methods allows facile modification of such polymer processing lines so that plastics sheets can be imparted with one or more silica layers as a part of the conventional polymer processing operation. For example, FIG. 2A shows such a modified polymer processing roll extrusion line where a plastic sheet is allowed to pass through a first environment 201 containing alkoxysilane vapors, a second purging environment 203 where convective air flow carries away any unadsorbed species, and a third environment 205 containing water vapor and catalyst before it is taken up by a final roll 207. Various different configurations, that will be apparent to one of ordinary skill in the art, are possible. For example, as shown in FIG. 2B, purging environment 203 may not be needed and the environments 201 and 205 may house multiple rollers.

Figure 3:
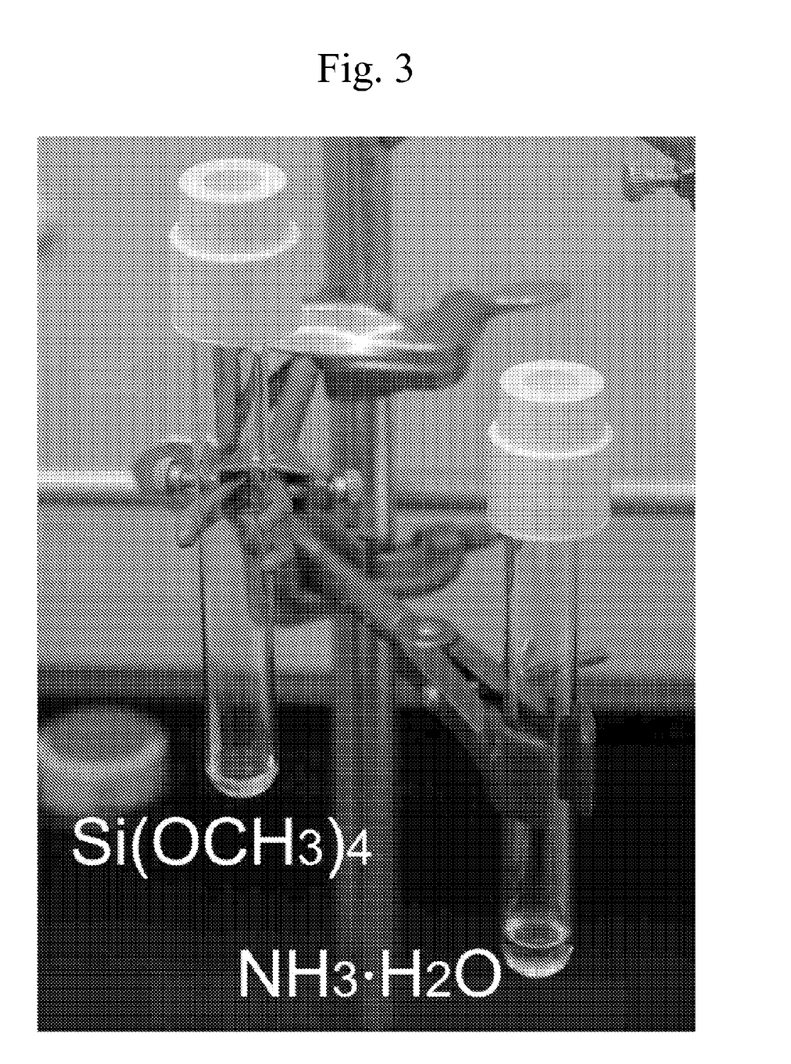
FIG. 3 is an experimental setup for the exposure of samples to $Si(OCH_3)_4$ (TMOS) and $NH_3$ vapor using $NH_3.H_2O$ solution. Samples were suspended from a wire within each of the two 25 mL test tubes.

In some other embodiments, as shown in FIG. 3, the present method can be carried in a benchtop instrument containing a first reservoir of the alkoxysilane source material and a second reservoir of the catalyst source material. Material to be coated with silica can be introduced into the first reservoir containing the alkoxysilane vapor then moved to the second reservoir containing the catalyst/water vapor to coat silica thereon.

Silica coatings are useful as a protective inorganic coating for soft and/or temperatures sensitive substrates that may decompose or leach out unwanted chemicals.

Silica coating of polymer (i.e., plastic) surfaces can be used to assist in chemical functionalization (with a higher degree of permanence) of the surface. The chemical functionalization of polymers could include modification of a surface for antimicrobial applications. In many cases, it is difficult to add arbitrary chemical groups to polymer surfaces. But, adding a layer of silica glass provides a clean surface on which to add almost anything by standard silane chemistry.

As another example, silica coating of polymer (i.e., plastic) surfaces can be used to assist chemical passivation (to prevent chemicals within from leaching out). By conformally coating an organic surface with a layer of silica, the leaching of undesired chemicals, for example Bisphenol-A, can be reduced. Such glass coatings may be used in the food industry.

Silica itself may not be anti-bacterial, however, a vapor-deposited silica coated as described herein can reduce the roughness of a polymer surface, to fill in small cracks or holes that bacteria may get into. In addition, it can be easily chemically functionalized, by silane chemistry (for example), to provide a desired anti-bacterial function.

In other embodiments, silica layers are grown around complex, non-planar structures, such as polymer spheres, at room temperature. The technique can be used, for example, to coat biological samples. Encapsulation of biological materials, such as cells, can be used for mechanical stability, protection from collapse and to enhance imaging.

There are many advantages of vapor phase growth over solution-based growth, such as the avoidance of capillary effects. The method also demonstrates greater flexibility than $SiCl_4$ as a reagent, which requires a closed (moisture-free) environment. Even without a sophisticated control over the humidity and $H_2O$ adsorption, uniform growth of silica multilayers can be achieved.

Another important outcome of low-temperature deposition is the ability to grow multilayers without distorting the underlying structure, which is very useful in controlling its porosity and increasing its mechanical stability. This is in contrast to high-temperature approaches used to control connectivity of overgrown structures (such as thermal sintering, i.e. 700-1100° C. for silica) that result in a contraction of the center-to-center distance between coated particles, to cause distortion and cracking.

There are a wide range of possible applications for nano/microscale growth of silica layers that would benefit from the simplicity of this method, such as in the engineering of MEMS structures, the fabrication of high-surface-area, porous shell structures, tuning the porosity of materials, 3D nanofabrication, sintering of particle-based films, cell encapsulation, and organic/inorganic layered composites. In addition, the method can find utility in the coating of a wide range of plastic materials. Films and rigid plastics coated with a thin deposition of silica can offer some particularly appealing benefits for food packaging. Foods packaged in these clear materials can provide barrier protection. The glass coating can be extremely thin, so that the plastic packaging can still be recycled without components separation. And finally, since no foil or metal is incorporated into the packaging, it is microwave-transparent and metal-detector friendly.

In other embodiments, the silica layers can be grown on biological materials, such as cells, in order to provide protection from the environment. Cell encapsulation has been used to enclose cells in a semipermeable nonimmunogenic sheath, for example to produce a desired substance, or to restore a lost function. In one application of cell encapsulation reported in the literature, transplanted cells are protected from immune rejection by an artificial, semipermeable membrane.

Further description of the method is provided with reference to the following examples, which are provided for the purposes of illustration and are not limiting of the invention.

EXAMPLE

Example 1

The silica growth was performed in a fumehood, using two 25 mL glass test tubes (1 cm diameter) containing ~5 mL of TMOS (Sigma-Aldrich, 98%) and ~5 mL ammonium hydroxide (Sigma-Aldrich, 30 Wt % solution), respectively (FIG. 3). Substrate samples were attached to a metal wire and suspended alternately in each of the test tubes, approximately 2 cm above the liquid surface, for periods of time discussed below. As a result, the substrate samples were exposed sequentially to TMOS and $NH_3/H2O$ vapors.

$SiO_2$ was deposited at room temperature onto 450 nm diameter polystyrene (PS) spheres (Invitrogen, sulfate-terminated) to produce $SiO_2$ shells. The spheres were immobilized onto a clean Si wafer by drying a 100 μL volume of 2% aqueous suspension, and exposed to 5 cycles of 10 min and 20 min in the TMOS and $NH_4OH$ test tubes at room temperature, respectively. The Si wafer was then heated at 450° C. for 2 h (in air, 5 h ramp) to burn away the polymer sphere template.

The growth of nanoscale silica multilayers was performed in a simple experimental setup shown in FIG. 3, by alternating the exposure of the substrate samples to TMOS and $NH_3/H2O$ vapors. TMOS temperature was maintained by submerging the TMOS in an oil bath, for example, maintained at 80° C. TMOS-based $SiO_2$ growth at 80° C. was used to coat polystyrene beads immobilized on the glass substrate.

The progress of silica deposition was monitored by SEM. Scanning electron microscopy (SEM) was performed using a Hitachi S-4500 at 1 kV (no Au coating), a JEOL 5600 (20 kV, with sputtered Au), or a Zeiss Ultra (10 kV, with sputtered Au). A transmission electron microscopy (TEM) (JEOL 2100) was used at 200 kV to image the SiO2 shells deposited onto a carbon-coated Cu grid. Optical measurements were made in reflectance using an Ocean Optics fiber optic UV-Vis spectrometer (SD-20) integrated through the eyepiece with an optical microscope (Olympus BX-51), using a 20× objective.

In some applications, silica as deposited at an average deposition rate of between 0.2-0.3 nm per TMOS exposure cycle, which is 3-4 times increased compared to 0.07-0.08 nm per cycle for $NH_3$-catalyzed TEOS ALD at room temperature. This growth rate depends on the relative humidity, and the thickness of the adsorbed hydration layer. While a more sophisticated, closed vacuum system is necessary to control these factors, the method as described herein demonstrates that the conditions of the ambient atmosphere are sufficiently suitable to achieve reasonable, nanoscale control over the layer thickness. The method can be used to tune macroscopically-measured properties, such as the changes in optical and mechanical properties characterized as a function of silica deposition cycles.

Figure 4:
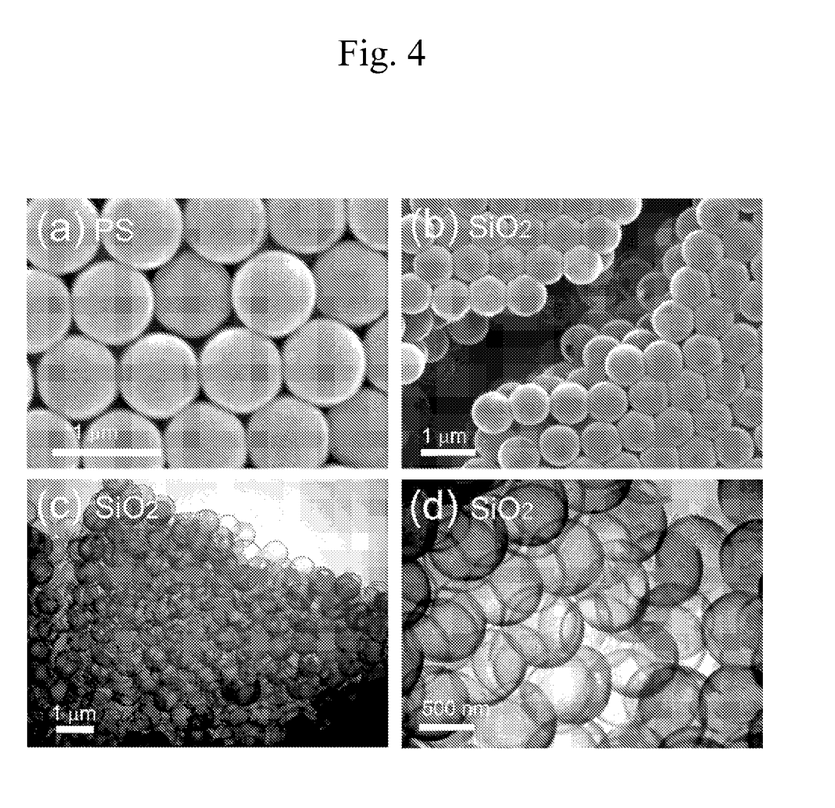
FIGS. 4A-4D are images of room-temperature deposition of $SiO_2$ on polystyrene spheres: (a) SEM of 700 nm PS spheres before $SiO_2$ deposition; (b) SEM of $SiO_2$ shells remaining after 5 growth cycles at room temperature around the PS sphere template and calcination at 450° C.; (c)-(d) Low- and high-magnification TEM images of the $SiO_2$ shells from (b), showing highly uniform $SiO_2$ wall thicknesses around 20 nm thick.

Growth was tested at room temperature conditions, to further increase the versatility of this method towards lower temperatures. FIG. 4 shows room temperature deposition (5 cycles) was found to uniformly coat the 700 nm PS spheres (FIG. 4A) with a $SiO_2$ layer around 20 nm thick, as shown in the SEM (FIG. 4B), and TEM (FIG. 4C, 3D) images of the porous shells that remain after the polymer template decomposition. The $SiO_2$ layer appears to evenly deposit throughout the structure of spheres, to create a coating with roughness on the order of 2-3 nm, as estimated from TEM imaging. In principle, higher temperatures (i.e.; 600-800° C.) could be used to further increase the densification of the $SiO_2$ shell walls, if needed. These results show that this method of $SiO_2$ growth at room temperature is a very easy way to deposit nanoscale $SiO_2$ structures using common, inexpensive equipment and chemical reagents.

As shown, even without a sophisticated control over the humidity and $H_2O$ adsorption, uniform growth of silica multilayers was achieved at a reproducible rate of approximately 0.2-0.3 nm per exposure using 80° C. conditions. At room temperature conditions the growth rate on polystyrene was found to be much faster (4-5 nm/exposure), which may be due to the extended exposure time in TMOS vapor.

Example 2

Figure 5:
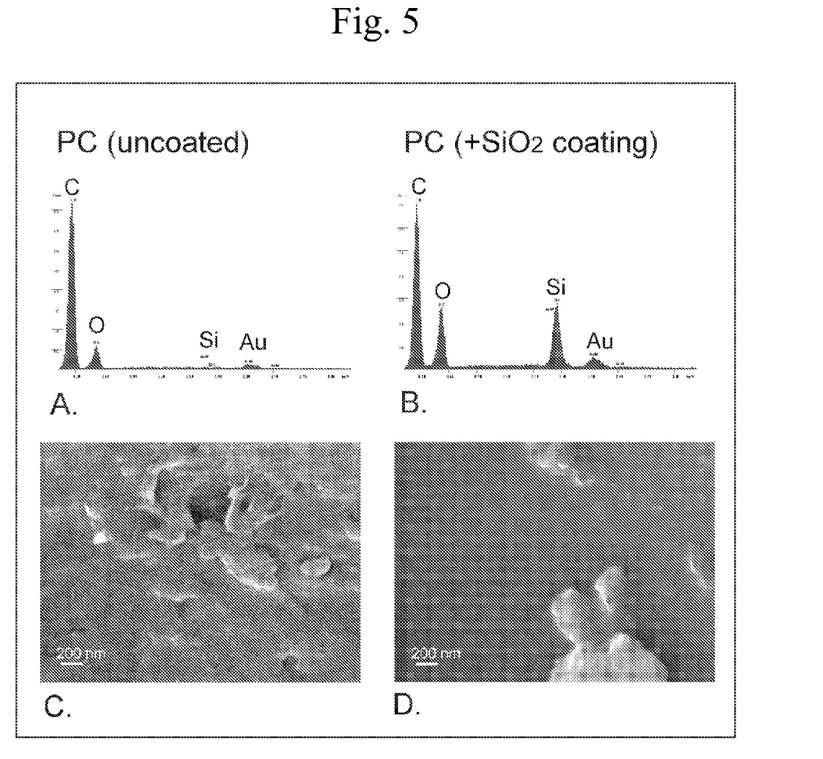
FIGS. 5A-5D show energy dispersive spectroscopy (EDS) spectra and scanning electron microscope (SEM) images of polycarbonate film before and after deposition with silica in accordance with certain embodiments.

A polycarbonate film was deposited similarly to Example 1, except three cycles of $TMOS/NH_4OH$ exposures were carried out at 60° C. FIGS. 5A and 5C show the energy dispersive spectroscopy (EDS) spectrum and scanning electron microscope (SEM) image of the uncoated polycarbonate film. FIGS. 5B and 5D show the EDS spectrum and SEM of the polycarbonate film coated with silica. As shown, silica deposits readily onto the polycarbonate film surface.

As will be apparent to one of ordinary skill in the art from a reading of this disclosure, the present invention can be embodied in forms other than those specifically disclosed above. The particular embodiments described above are, therefore, to be considered as illustrative and not restrictive. The scope of the invention is as set forth in the appended claims, rather than being limited to the examples contained in the foregoing description. For example, suitable ambient conditions can be applied to other alkoxide precursors, depending on their volatility and reactivity.

What is claimed is:

1. A method of forming a silica film, comprising:
    exposing an organic substrate to a vapor of alkoxysilane at ambient pressure and at a temperature below 150 ° C. such that the alkoxysilane is adsorbed on the substrate; and then
    converting the adsorbed alkoxysilane into silica by exposure to water vapor and a catalyst at ambient pressure without exposure to plasma;
    wherein the alkoxysilane does not substantially react with water vapor in the ambient pressure condition during said exposing an organic substrate to a vapor of alkoxysilane.

2. The method of claim 1, wherein the substrate is a temperature sensitive substrate and the temperature of the substrate is below a temperature that destabilizes, decomposes or melts the substrate.

3. The method of claim 1, wherein the substrate is a polymeric material.

4. The method of claim 1, wherein the substrate is a biologic material.

5. The method of claim 1, wherein the alkoxysilane comprises tetramethoxysilane.

6. The method of claim 1, wherein the catalyst comprises $NH_3$.

7. The method of claim 1, wherein the alkoxysilane vapor is obtained by heating a source of alkoxysilane.

8. The method of claim 7, wherein the alkoxysilane source is heated to a temperature of less than 100 ° C.

9. The method of claim 1, wherein the alkoxysilane vapor is at room temperature.

10. The method of claim 1, wherein said exposing and said converting are repeated.

11. The method of claim 8, wherein said exposing and said converting are repeated in the range of 10 to 1000 times.

12. The method of claim 1, wherein the substrate is exposed to the alkoxysilane vapor for a time in the range of 1 second to 120 minutes.

13. The method of claim 1, wherein the substrate is exposed to the water vapor for a time in the range of 30 second to 60 minutes.

14. The method of claim 1, wherein the substrate is a plastic film.

15. The method of claim 14, wherein the plastic film is a plastic used in food packaging applications.

16. The method of claim 14, wherein said exposing and said converting are carried out as part of a continuous plastic film producing process.

17. The method of claim 1, further comprising purging unadsorbed alkoxysilane vapors after said exposing.

18. The method of claim 1, further comprising purging unadsorbed water and unadsorbed catalyst after said converting.

19. The method of claim 1, wherein the substrate is a biological cell.

\* \* \* \* \*

UNITED STATES PATENT AND TRADEMARK OFFICE
CERTIFICATE OF CORRECTION

PATENT NO. : 8,993,063 B2  Page 1 of 1
APPLICATION NO. : 13/702497
DATED : March 31, 2015
INVENTOR(S) : Aizenberg et al.

It is certified that error appears in the above-identified patent and that said Letters Patent is hereby corrected as shown below:

In the specification

Column 1, delete lines 13-21.

"STATEMENT REGARDING FEDERALLY SPONSORED RESEARCH OR DEVELOPMENT
The present invention was made with United States government support under Grant No. N00014-07-1-0690-DOD35CAP awarded by the Office of Naval Research, and under Grant No. FA9550-09-0669-DOD35CAP awarded by the Air Force Office of Scientific Research. The United States government has certain rights in the invention."

Signed and Sealed this
First Day of December, 2015

Michelle K. Lee
*Director of the United States Patent and Trademark Office*